US012003927B2

(12) United States Patent
Revelli et al.

(10) Patent No.: US 12,003,927 B2
(45) Date of Patent: Jun. 4, 2024

(54) METHOD AND SYSTEM FOR MONITORING AND REPORTING SPEAKER HEALTH

(71) Applicant: Dolby Laboratories Licensing Corporation, San Francisco, CA (US)

(72) Inventors: Luca Revelli, Larkspur, CA (US); William Joseph Dymek, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 182 days.

(21) Appl. No.: 17/633,102

(22) PCT Filed: Aug. 14, 2020

(86) PCT No.: PCT/US2020/046548
§ 371 (c)(1),
(2) Date: Feb. 4, 2022

(87) PCT Pub. No.: WO2021/030767
PCT Pub. Date: Feb. 18, 2021

(65) Prior Publication Data
US 2022/0337965 A1    Oct. 20, 2022

Related U.S. Application Data

(60) Provisional application No. 62/886,910, filed on Aug. 14, 2019.

(30) Foreign Application Priority Data

Nov. 21, 2019 (EP) .................................... 19210577

(51) Int. Cl.
H04R 29/00     (2006.01)
G10L 21/0232   (2013.01)
(Continued)

(52) U.S. Cl.
CPC ........ *H04R 29/001* (2013.01); *G10L 21/0232* (2013.01); *H03G 3/3005* (2013.01);
(Continued)

(58) Field of Classification Search
CPC ........ H04R 29/001; H04R 9/06; H04R 3/007; H04R 29/003; H04R 3/04; H04S 7/301;
(Continued)

(56) References Cited

U.S. PATENT DOCUMENTS

2006/0126857 A1*  6/2006  Pavlov ................. H04R 29/003
                                                                381/59
2006/0251265 A1   11/2006  Asada
(Continued)

FOREIGN PATENT DOCUMENTS

CN       107734427 A  *  2/2018
DE    102010047220 B4     7/2012
(Continued)

OTHER PUBLICATIONS

Leach et al., Loudspeaker Voice coil inductance Losses: Circuit Models, Parameter estimation and effect on frequency response (Year: 2002).*

*Primary Examiner* — Carolyn R Edwards
*Assistant Examiner* — Kuassi A Ganmavo

(57) ABSTRACT

A method is provided, including: defining a plurality of frequency bins; sending, during a training phase, a test signal at different amplitude levels to one or more speakers, and gathering resulting test voltage (V) and current (I) points for the different amplitude levels and for each frequency bin; for each frequency bin, applying a linear regression algorithm to the gathered test voltage and current points for the different amplitudes to obtain a reference electrical impedance of said one or more speakers; sending, during a monitoring phase subsequent to said training phase, an audio
(Continued)

signal to said one or more speakers, and gathering resulting new voltage and current points to obtain an operating electrical impedance for said one or more speakers for each frequency bin, determining a deviation between the operating and the reference electrical impedance, and, if the deviation exceeds a defined tolerance, reporting the deviation to a user.

17 Claims, 9 Drawing Sheets

(51) Int. Cl.
  *H03G 3/30* (2006.01)
  *H04R 3/00* (2006.01)
  *H04R 3/04* (2006.01)
  *H04R 9/06* (2006.01)
  *H04S 3/00* (2006.01)
  *H04S 7/00* (2006.01)

(52) U.S. Cl.
  CPC ............... *H04R 3/007* (2013.01); *H04R 3/04* (2013.01); *H04R 9/06* (2013.01); *H04R 29/003* (2013.01); *H04S 3/008* (2013.01); *H04S 7/301* (2013.01); *H04S 2400/01* (2013.01)

(58) Field of Classification Search
  CPC . H04S 2400/01; H04S 3/008; G10L 21/0232; H03G 3/3005
  See application file for complete search history.

(56) References Cited

U.S. PATENT DOCUMENTS

| | | | |
|---|---|---|---|
| 2012/0139752 A1* | 6/2012 | Waymire | G08G 1/0965 340/902 |
| 2012/0288118 A1 | 11/2012 | Gautama | |
| 2012/0294450 A1* | 11/2012 | Ozcan | H04R 29/003 381/59 |
| 2013/0058492 A1* | 3/2013 | Silzle | H04R 29/002 381/59 |
| 2014/0270209 A1* | 9/2014 | Mihelich | H04R 29/001 381/59 |
| 2015/0030169 A1* | 1/2015 | Pan | H04R 29/001 381/59 |
| 2015/0230037 A1 | 8/2015 | Gautama | |
| 2016/0337772 A1* | 11/2016 | Bothe | H04R 29/002 |
| 2017/0257686 A1* | 9/2017 | Gautama | H04R 1/00 |
| 2017/0347188 A1 | 11/2017 | Thyssen | |
| 2017/0347189 A1 | 11/2017 | Thyssen | |
| 2020/0036348 A1 | 1/2020 | Butler | |
| 2021/0211038 A1 | 7/2021 | Healy | |
| 2021/0235192 A1 | 7/2021 | Healy | |

FOREIGN PATENT DOCUMENTS

| | | | | |
|---|---|---|---|---|
| EP | 2369852 B1 | | 8/2014 | |
| EP | 2070388 B1 | * | 5/2018 | ........... H04R 29/007 |
| WO | 2008036992 W | | 4/2008 | |
| WO | 2014045123 A2 | | 3/2014 | |
| WO | 2017132597 W | | 8/2017 | |

* cited by examiner

| | Bin 0 | Bin 1 | Bin 2 | Bin 3 | ... | Bin N |
|---|---|---|---|---|---|---|
| 710 | V, I | V, I | V, I | V, I | ... | V, I |
| | V, I | V, I | V, I | V, I | ... | V, I |
| | V, I | | V, I | V, I | ... | |
| | | | V, I | | ... | |
| | | | | | ... | |

METHOD AND SYSTEM FOR MONITORING AND REPORTING SPEAKER HEALTH

CROSS-REFERENCE TO RELATED APPLICATIONS

This application claims priority to United States Provisional Patent Application No. 62/886,910, filed 14 Aug. 2019, and European Patent Application No. 19210577.3, filed 21 Nov. 2019, both of which are incorporated herein by reference.

TECHNICAL FIELD

One or more implementations relate generally to speaker systems, and more specifically to monitoring and reporting speaker health.

BACKGROUND

Advanced cinema sound systems using high-power amplifiers and new immersive audio formats, such as Dolby Atmos® generate many channels of audio for playback through large numbers of speakers in extensive arrays. Such arrays typically expand on existing surround sound formats by adding multiple speakers per group, such as front/rear, front left/front right, rear left/rear right, and so on. For immersive audio playback, overhead mounted height speakers may also be provided.

New cinema or large-scale audio systems feature multiple output channels to drive multiple speakers per surround channel. Speaker arrays of 32 to 64 or more speakers are not uncommon, and each speaker may be a multi-driver unit having woofer, mid-range drivers, and tweeters, all with a multitude of physical and/or wireless connections. In an extensive audio playback environment maintaining sound quality after an initial installation may be difficult due to degradation or failure of sensitive components (e.g., tweeter voice coils), and the simple aging of equipment. During use, many different electrical or electro-mechanical problems can arise, such as blown drivers, bad physical connections, wireless signal interference, and so on. In a large-scale installation, such as a cinema, correcting such problems often requires a repair technician to diagnose each speaker individually to find the specific problem, and effect repairs or replacement in often difficult operating environments, such as for overhead or high wall-mounted speakers. In many cases, diagnostic and repair activities may be deferred until the sound quality is significantly degraded, thus leading to a situation in which audiences may be subjected to lower than expected audio quality.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

SUMMARY OF EMBODIMENTS

A speaker health monitor and reporting component and method takes current and voltage (V-I) measurements of the speakers when configured to operate in a reference mode to obtain a reference electrical impedance for the speakers. It then takes V-I measurements of the speakers while they are operating in a normal playback mode to obtain an operating electrical impedance. It compares the operating electrical impedance to the reference electrical impedance to determine a deviation between the operating and the reference electrical impedances, and reports any deviation that exceeds a defined tolerance to repair personnel for enabling repair of an electrical or electro-mechanical fault of the speakers.

Embodiments include methods and systems that continuously monitor the health of speakers and speaker components as compared to an initial baseline condition for a new installation, detect an out of tolerance condition, and provide detailed actionable reports to a technician, system operator/owner, or other appropriate personnel.

Embodiments are yet further directed to methods of making and using such speaker health monitoring and condition reporting components for use in an audio playback system.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Figure 1:
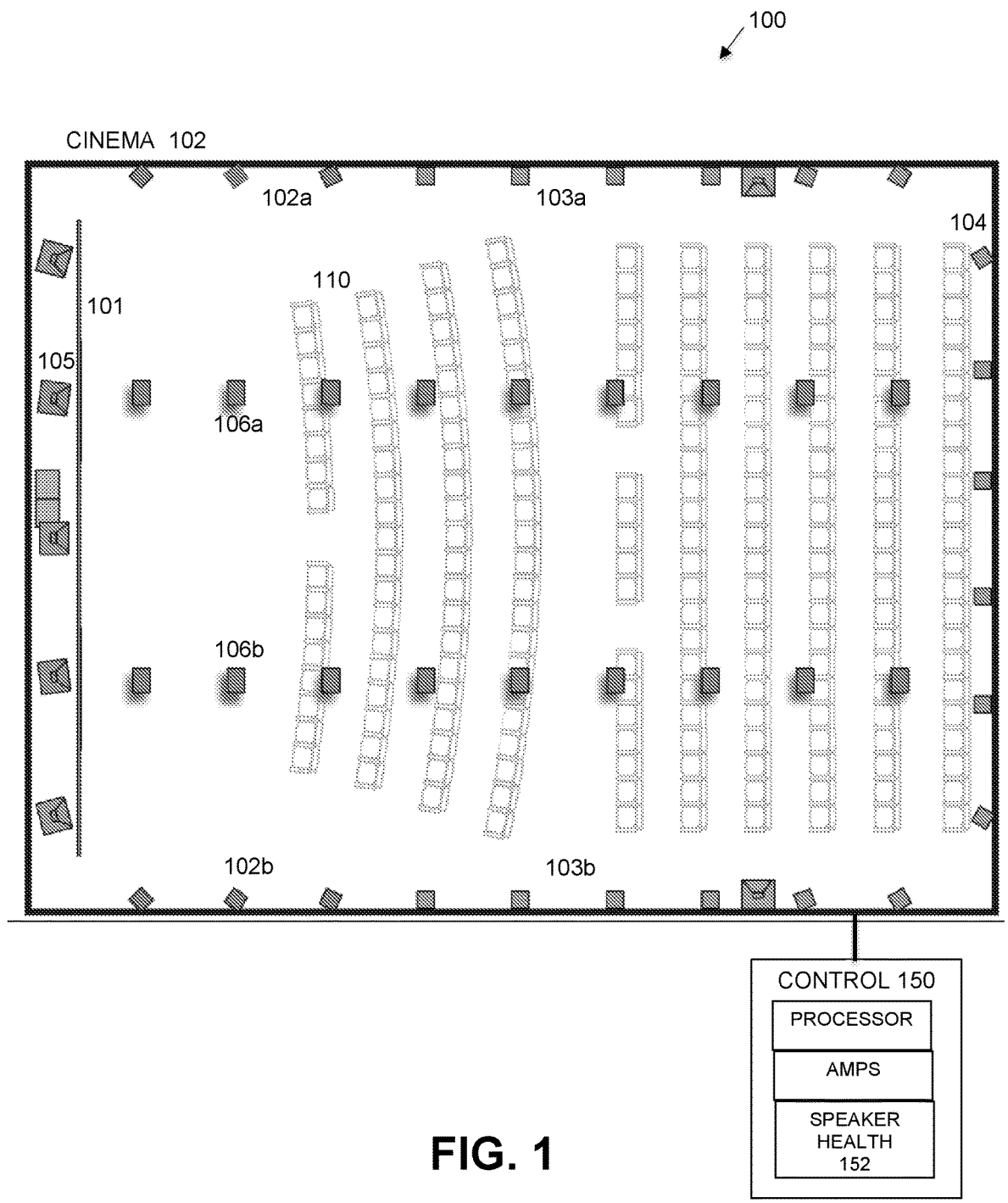
FIG. 1 illustrates an audio playback environment having a large number of speakers driven by a multi-channel cinema processor and high-powered amplifier, under some embodiments.

Systems and methods are described for a speaker health monitor and reporting system for use in a speaker installation. The system monitors certain electrical and electromechanical characteristics of individual speaker components including the condition of individual drivers within the speaker and physical connections to the speaker. It establishes baseline operating characteristics, continuously monitors the speakers during normal operation, and reports any deviations between operating characteristics and the baseline condition to facilitate efficient repairs to any of the system components. Such as system addresses issues associated with having large numbers of speakers in a large installation, which places a high burden proper speaker maintenance, by continuously monitoring the electro/electromechanical health of speakers, identifying specific problems, and providing actionable reports so that appropriate personnel can efficiently make the necessary repairs.

Aspects of the one or more embodiments described herein may be implemented in an audio or audio-visual (AV) system that processes source audio information in a mixing, rendering and playback system that includes one or more computers or processing devices executing software instructions. Any of the described embodiments may be used alone or together with one another in any combination. Although various embodiments may have been motivated by various deficiencies with the current and known solutions, which may be discussed in the specification, the embodiments do not necessarily address any of these deficiencies. Different embodiments may address different deficiencies, and some may only be partially addressed.

For purposes of the present description, the following terms have the associated meanings: the term "channel" means an audio signal plus metadata in which the position is coded as a channel identifier, e.g., left-front or right-top surround; "channel-based audio" is audio formatted for playback through a pre-defined set of speaker zones with associated nominal locations, e.g., 5.1, 7.1, and so on (i.e., a collection of channels as just defined); the term "object" means one or more audio channels with a parametric source description, such as apparent source position (e.g., 3D coordinates), apparent source width, etc.; "object-based audio" means a collection of objects as just defined; and "immersive audio," (alternately "spatial audio" or "adaptive audio") means channel-based and object or object-based audio signals plus metadata that renders the audio signals based on the playback environment using an audio stream plus metadata in which the position is coded as a 3D position in space; and "listening environment" means any open, partially enclosed, or fully enclosed area, such as a room that can be used for playback of audio content alone or with video or other content, and can be embodied in a home, cinema, theater, auditorium, studio, game console, and the like. The term "speaker" or "loudspeaker" means an audio playback speaker having a cabinet enclosing one or more drivers, where the term "driver" means an individual audio transducer that converts an electrical audio signal into sound waves, and may be implemented as a cone, horn, or planar driver, and may be a full-range driver or configured to playback a certain frequency range, such as a tweeter, mid-range driver, woofer, sub-woofer, and so on.

FIG. 1 illustrates an audio playback environment using a large number of speakers driven by a multi-channel cinema processor and high-powered amplifier, under some embodiments. FIG. 1 illustrates an example cinema environment having a surround sound speaker array powered by cinema processors and power. As shown in FIG. 1, cinema 102 includes a screen 101 at one end of the room facing a number of seats 110 in the viewing/listening area. A number of speakers 105 are arrayed in the front of the cinema room and speakers 104 are in the rear of the cinema room. These play the front and rear surround signals. A set of speakers 102a and 103a provide the right side sound, which may be divided into right-front 102a and right-rear 103a signals, while another set of speakers 102b and 103b provide the left-front and left-rear signals. In an immersive audio environment, overhead speakers projecting down from the ceiling may be provided. For the example of FIG. 1, such overhead speakers are shown in an array of two rows 106a and 106b. The overhead sound may also be provided (at least partly) by one or more side or floor mounted speakers projecting sound upwards for reflection off of the ceiling back into the listening area 110.

As shown in FIG. 1, a relatively large number of speakers may be provided such that a number of individual speakers is provided for each surround-sound channel. The number of speakers depends on the size of the cinema (or auditorium), the nature of the audio content, the power and output configuration of the power amp or amps, and other similar parameters. The cinema environment and speaker configuration of FIG. 1 is intended for illustration only, and any other practical configuration and number of speakers may be used.

In the cinema context, speakers generally handle high signal levels and are called on to reproduce complex audio content and problems associated with the speakers may occasionally occur. As can be seen in FIG. 1, the sheer number of speakers (each of which may comprise two or more drivers, as well as their problematic placement or installation (e.g., on the ceiling or behind the screen or walls) poses some challenges to easily diagnosing and fixing any problems that may occur. Because most speaker problems require physical fixes, such as changing drivers, fixing connections, or replacing speakers themselves, such service work is often time consuming and expensive. Entire arrays or sub-arrays of speakers may need to be individually tested or inspected speaker by speaker to find a problem that may be caused by a single speaker in the array. In a frequently used audio environment, such as a movie theatre, concert hall, and so on, such an operation may require a shutdown of the venue for an appreciable amount of time.

Embodiments of a speaker system, such as shown in FIG. 1 include a speaker health component and process that facilitates detecting and identifying speakers that exhibit problems. This allows technicians to quickly locate a problematic speaker and identify the specific problem to apply the appropriate fix without requiring extensive system inspection and speaker diagnosis.

The cinema system of FIG. 1 typically includes a sound processor and one or more power amplifiers to drive all the speakers in the system. In a typical implementation, the processor and/or amplifiers may be as unitary or separate rackmount components installed in an A/V booth of the cinema or auditorium control room. Such components may be provided in a control center 150 provided in a control booth or similar location in the room. As shown in FIG. 1, the control center also includes a speaker health monitoring and reporting component 152.

Figure 2:
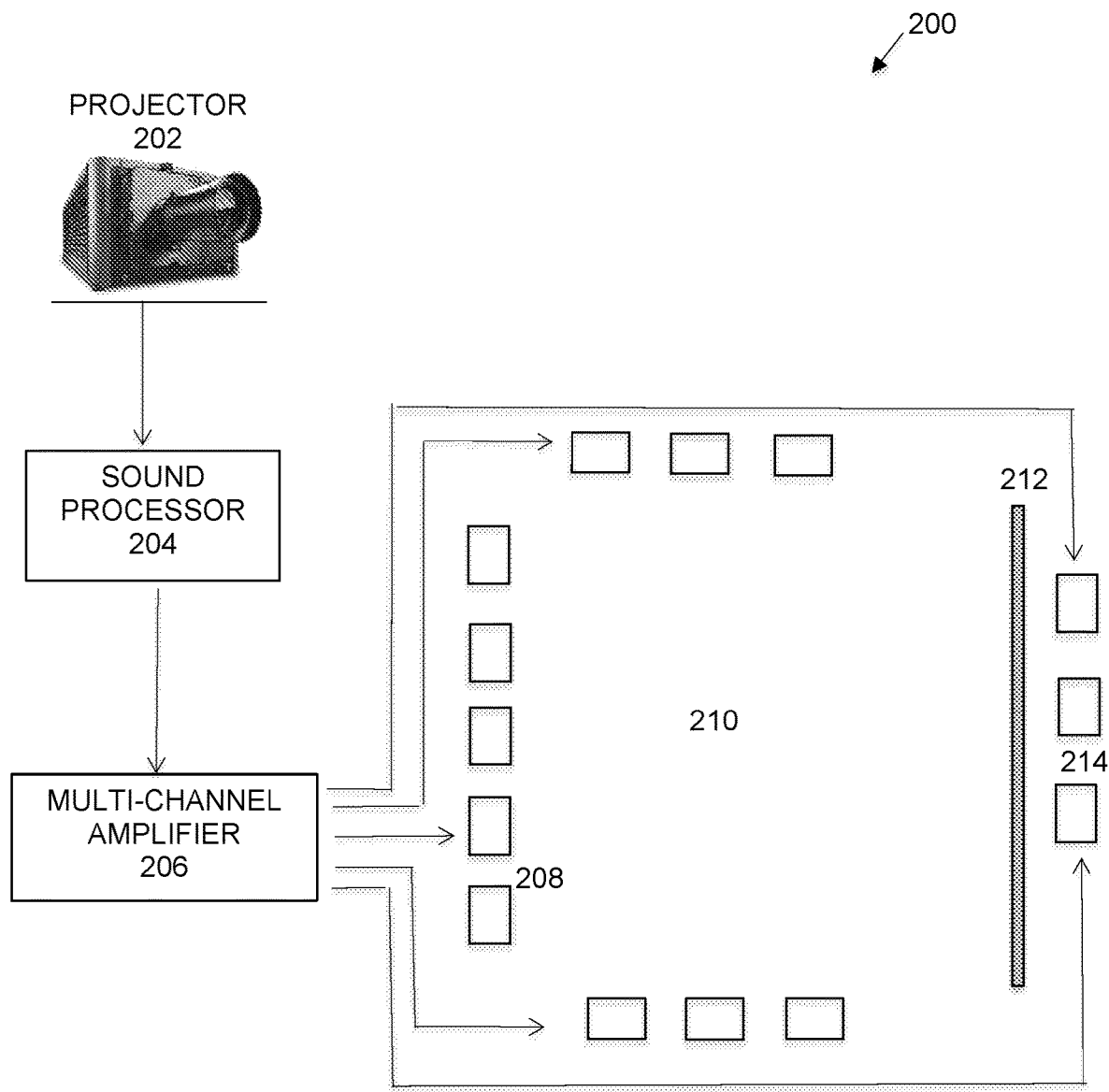
FIG. 2 illustrates a cinema environment having a surround sound speaker array powered by a multi-channel power amplifier under some embodiments.

FIG. 2 illustrates a cinema environment having a surround sound speaker array powered by a multi-channel power amplifier under some embodiments. As shown in FIG. 2, a cinema or similar audio/visual (A/V) listening environment 210 has an array of speakers 208 and 214 placed around screen 212 and the listening environment in any appropriate surround sound arrangement (e.g., 5.1, 7.1, 9.1, etc.). The audio content is provided by projector 202 through a sound processor 204 and then to a multi-channel amplifier 206. Multi-channel amplifier 206 drives the speakers 208 and 214 through individual speaker feeds. Each speaker element 208 shown in FIG. 2 may represent a number of individual speakers so that the total number of speakers is more similar to that shown in FIG. 1. For the embodiment of FIG. 2, the amplifier 206 may represent a multi-amp rackmount system having a number of amplifier cards that slot into a rack, where each amplifier drives a certain number of channels, such as 8-channels each, or similar. The amplifier may also be embodied as a single unitary amplifier with multiple channel outputs. Alternatively, it may be implemented as two or more amplifiers connected together in a serial or daisy-chain fashion so that an amplifier system is formed having a master/slave configuration. In an embodiment, all or most of the speakers may be passive speakers, thus requiring relatively high power output from the amplifiers. Alternatively, at least some of the speakers may be active (powered), thus requiring less power from the amplifiers. The amplifier configuration may be tailored such that different amps drive different sets of interleaved speakers, and so on. In an embodiment, the number of channels is increased by the each individual amplifier, such as 2×24 channels for a total of 48 channels for one or two amps in amp system. Alternatively, the master/slave amps may be configured such that number of channels remains the same, but the power overhead for each channel increases through the additional amplifier, or any other similar combination of channel and/or power overhead increase. Any number of different amplifier configurations is possible depending on the speaker array configuration and cinema environment.

For an embodiment in which an analog amplifier may be available to power the speakers, such as an older cinema installation, the amp system may be coupled to the analog amp through a digital-audio-converter (DAC) to convert the digital signals from the renderer or sound processor 204 into the requisite analog signals for the analog amp.

Figure 3:
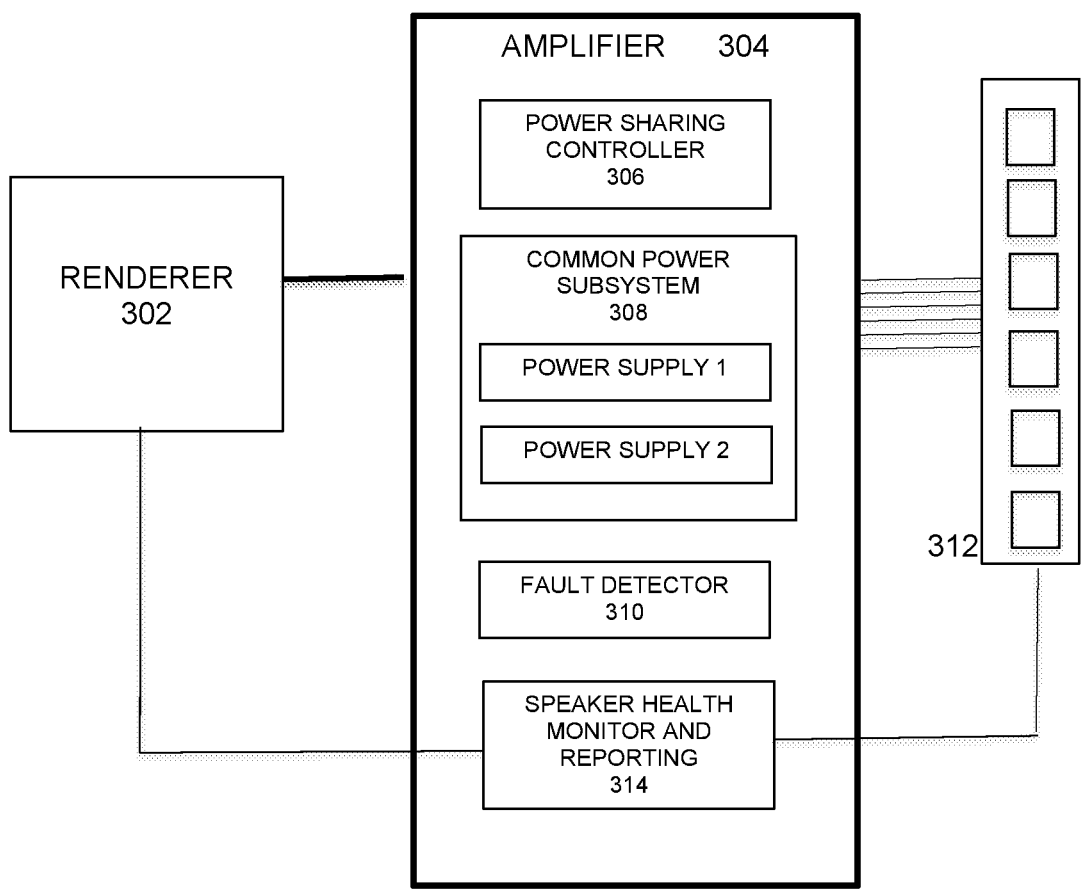
FIG. 3 is a block diagram illustrating main functional components of a multi-channel amplifier, under some embodiments.

FIG. 3 is a block diagram illustrating main functional components of a multi-channel amplifier, under some embodiments. For the system of FIG. 3, audio signals from renderer 302 are amplified in amplifier 304 and transmitted to speaker array 312.

In an embodiment, the speakers 312 of FIG. 3 are configured and placed to playback immersive audio content in which audio signals being presented to the listener originate from in front of and around the listening position in the horizontal plane (main speakers) and overhead plane (height speakers). A full loudspeaker system layout may consist of: front loudspeakers (e.g., Left, Center, Right, and optionally Left Center Right Center, Left Screen, Right Screen, Left Wide, and Right Wide), Surround loudspeakers (e.g.: Left Surround, Right Surround, and optionally Left Surround 1, Right Surround 1, Left Surround 2, Right Surround 2), surround back loudspeakers (e.g., Left Rear Surround, Right Rear Surround, Center Surround, and optionally Left Rear Surround 1, Right Rear Surround 1, Left Rear Surround 2, Right Rear Surround 2, Left Center Surround, Right Center Surround), height loudspeakers (e.g., Left Front Height, Right Front Height, Left Top Front, Right Top Front, Left Top Middle, Right Top Middle, Left Top Rear, Right Top Rear, Left Rear Height, Right Rear Height), and subwoofer speakers. This represents one example of a speaker configuration, and other configurations are also possible.

Component 302 generally represents an audio component that is generally referred to as a "renderer." Such a renderer may include or be coupled to a codec decoder that receives audio signals from a source, decodes the signals and transmits them to an output stage that generates speaker feeds to be transmitted to individual speakers in the room. In an immersive audio system, the channels are sent directly to their associated speakers or down-mixed to an existing speaker set, and audio objects are rendered by the decoder in a flexible manner Thus, the rendering function may include aspects of audio decoding, and unless stated otherwise, the terms "renderer" and "decoder" may both be used to refer to an immersive audio renderer 302, such as shown in FIG. 3, and in general, the term "renderer" refers to a component that transmits speaker feeds to the speakers, which may or may not have been decoded upstream. In an embodiment, the AVR or renderer/decoder 305 of FIG. 3 comprises an audio/video receiver for use in home entertainment environments. The AVR generally perform multiple functions. First, it provides a connection point for multiple source devices, and the AVR is responsible for switching among the inputs, and second, it performs audio decoding and processing (e.g., surround sound processing, Dolby Pro Logic™ processing, Dolby Digital™ processing, Dolby TrueHD™ processing, etc.). It may also provide amplification or pre-amplification for speakers. For the embodiment of FIG. 3, the amplification to drive the speakers 312 is provided by amplifier 304.

In an embodiment, amplifier 302 is a multi-channel, Class-D amplifier that comprises main functional components of a power sharing controller 306, a power subsystem 308, and a fault detector 310. A speaker health monitor and reporting component 314 may be provided as part of the amplifier or as a separate component that provides certain operating and environmental condition data to the amplifier 314.

In an embodiment, the amplifier 304 provides power sharing or power steering of the common power sub-system 308 across all of the channels of a multi-channel speaker output stage. In an example configuration, up to 24 channels may be supported, but other possible embodiments are not so limited. The power subsystem (or "power supply stage") 308 may utilize two redundant power supplies (e.g., connected in series or parallel), though other single or multi-power supply configurations are also possible. The power supplies are redundant in that failure of one supply will cause the other supply to activate and provide power to the amplifier. The fault detector 310 monitors the status of the power subsystem 308 and detects the health of the power supplies. It is configured to shut down a failing supply if an error is detected and utilize the remaining power supply to power the unit.

In an embodiment, a speaker health monitor and reporting component 314 continuously (or periodically) samples the audio performance of the theatre or cinema 102 on a regular basis and detects and predicts speaker issues, such as a drop in performance, a shorted or open driver or one that has introduced rub/buzz to the audio. The amplifier is configured to send a report through GUI or signaling component to indicate a speaker fault condition. Alternatively, it may be configured to shut that channel down and notify the renderer 302 to re-render the content, mapping out that faulty speaker and use the other speakers to compensate for the failed or missing speaker. It may also be configured to detect non-speaker performance issues, such as rub and buzz, in a fixture or tile in the theatre, so as to prevent unnecessary checking of the speakers. All of this information may be accommodated through re-rendering, or it can be reported to repair personnel.

As shown in FIG. 3, the amplifier 304 includes a speaker health monitoring and reporting component 314 that monitors certain electrical and electro-mechanical characteristics of individual speaker components including the condition of individual drivers within the speaker and physical connections to the speaker. It establishes baseline operating characteristics, such as base speaker impedances, continuously monitors the speakers during normal operation, and reports any deviations between operating characteristics (e.g., operating speaker impedances) and the baseline condition to facilitate repair of any speaker. In general, the main characteristic of a speaker driver is its electrical impedance, Z, as a function of frequency, which can be plotted as an impedance curve graph. With regard to speaker health monitoring, the voltage (Vx) and current (Ix) parameters can be used to provide the frequency response of a speaker (using Fourier transforms) and can help gauge the health of individual drivers. This is done by measuring impedance (Z=V/I) and verifying that it matches the expected curve for the speaker. A system can flag the speaker as broken or damaged based on any deviation from this expected curve, thus facilitating an efficient repair, turning off that speaker during operation, or causing re-rendering of the audio to accommodate the speaker failure.

This simple V/I approach may detect only a simple open and short circuit condition in a speaker under most circumstances. As such, it may fail to detect more complex or subtle issues, like a blown tweeter in a two-way speaker. This is because an open tweeter downstream of the passive crossover filter will manifest itself as a small variation in the impedance (I) curve, which may not large enough to trigger the "open" failure at the output of the amplifier. Such a condition may be due to the fact that the impedance changes only at higher frequencies. Other similar electro or electro-mechanical failure conditions may also slip detection by standard V/I measurements. In an embodiment, the speaker health monitor and reporting component 314 includes a speaker fault detection process that detects variation in the impedance curve of each speaker.

Figure 4:
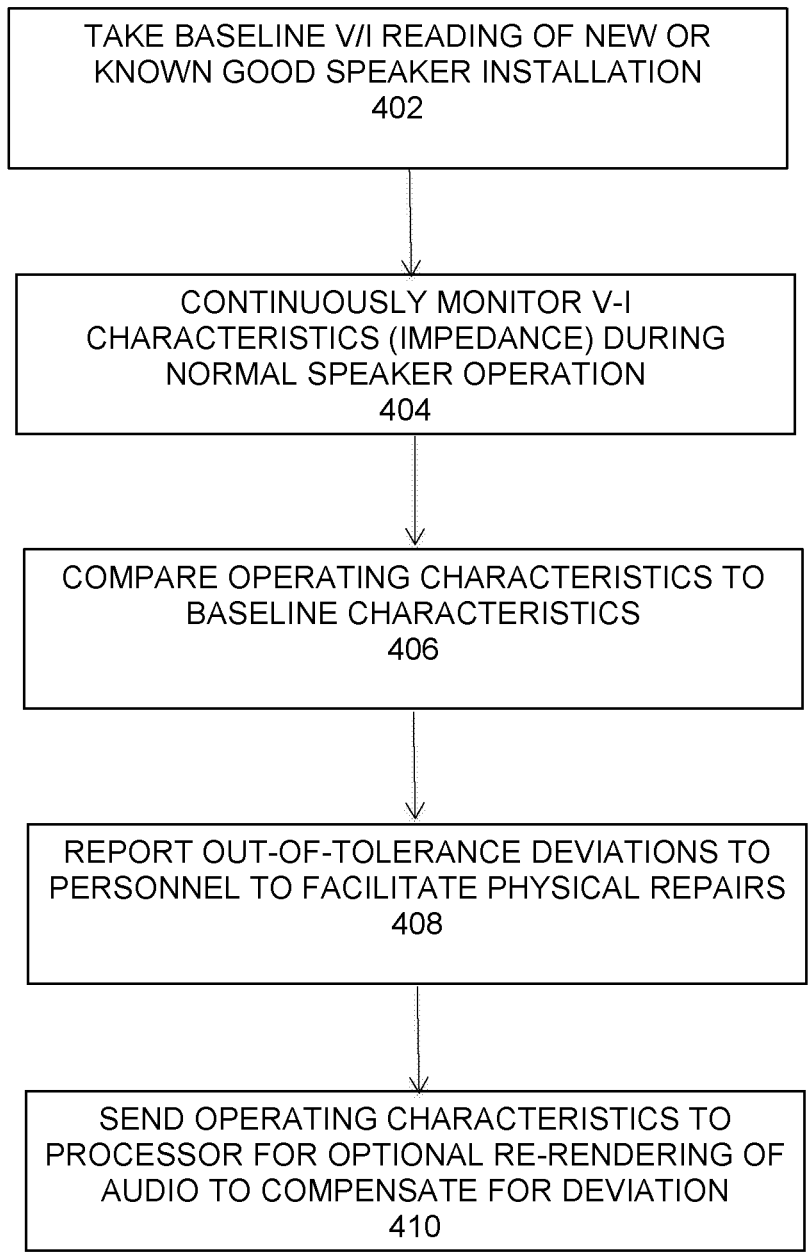
FIG. 4 is a flowchart that illustrates a general method of calibrating, monitoring, and reporting speaker health, under some embodiments.

FIG. 4 is a flowchart that illustrates a general method of calibrating, monitoring, and reporting speaker health using impedance curve comparisons, under some embodiments. The method of FIG. 4 begins with taking measurements of a new speaker installation in a cinema (or similar venue) or measurements of a known good installation, that is, one in which all speaker components are known to be operating as designed or intended, step 402. In an embodiment, this is done by playing a test signal (e.g., pink noise) through the speakers and taking V, I measurements of each speaker using one or more Hall effect sensors in the amplifier. Current and voltage measurements are taken for each channel at different amplitude levels to provide a comprehensive V, I curve for each channel. This establishes a known good baseline measurement against which the speakers in actual operation will be compared.

In step 404, the speakers are continuously monitored to measure the same V, I characteristic, regardless of whether or not test tones or actual theatrical content is used. The frequency of the monitoring process can be set based on system configuration constraints and requirements. In one embodiment, a constant playback analysis system can be used. Alternatively, the system can be configured to monitor the speakers only during certain conditions, such as no monitoring during known non-operation, or during playback of signals that are irrelevant or outside of interest; or on a longer periodic basis, such as once per hour, once per day, and so on.

In step 406, the operating characteristics are compared to the baseline comparison through a direct comparison of their respective V, I curves. Any deviation of the operating and baseline data may indicate a fault condition caused by speaker or driver failure, such due to a driver open or short circuit, bad connection, and so on. The deviation may be defined by a tolerance given to the baseline curve, such as a minimum percentage deviation within a certain range based on the frequency, amplitude or other characteristic of the audio signal.

Any deviation in excess of the defined tolerance for the baseline is reported to appropriate personnel through a reporting mechanism, step 408. Such a reporting mechanism could be a visual indication, such as through the amplifier front panel (e.g., warning light or message), a web-based GUI; a standard network message, such as an SNMP (Simple Network Management Protocol); or a proprietary message, such as a Dolby Cinema Processor message. The alert or message is intended to flag and identify the problematic speaker or speakers so that appropriate personnel, such as the installer or technician can take action to solve the problem, without undue testing or diagnosis of the speakers, some of which may be difficult to access.

In an embodiment, the operating characteristics can be sent to the cinema processor or renderer to allow the system to re-render the audio signal to bypass the problematic speaker or otherwise compensate for the lost or compromised speaker output, step 410.

The V, I characteristics of the speakers may represent the electrical impedance of the speakers. Thus, with respect to FIG. 4, the speaker health monitor and reporting component takes current and voltage (V-I) measurements of the speakers when configured to operate in a reference mode to obtain a reference electrical impedance (or "baseline characteristic") for the speakers, it then takes V-I measurements of the speakers while they are operating in a normal playback mode to obtain an operating electrical impedance. It compares the operating electrical impedance to the reference electrical impedance to determine a deviation between the operating and the reference electrical impedances, reports any deviation that exceeds a defined tolerance to repair personnel for enabling repair of an electrical or electro-mechanical fault of the speakers.

Figure 5:
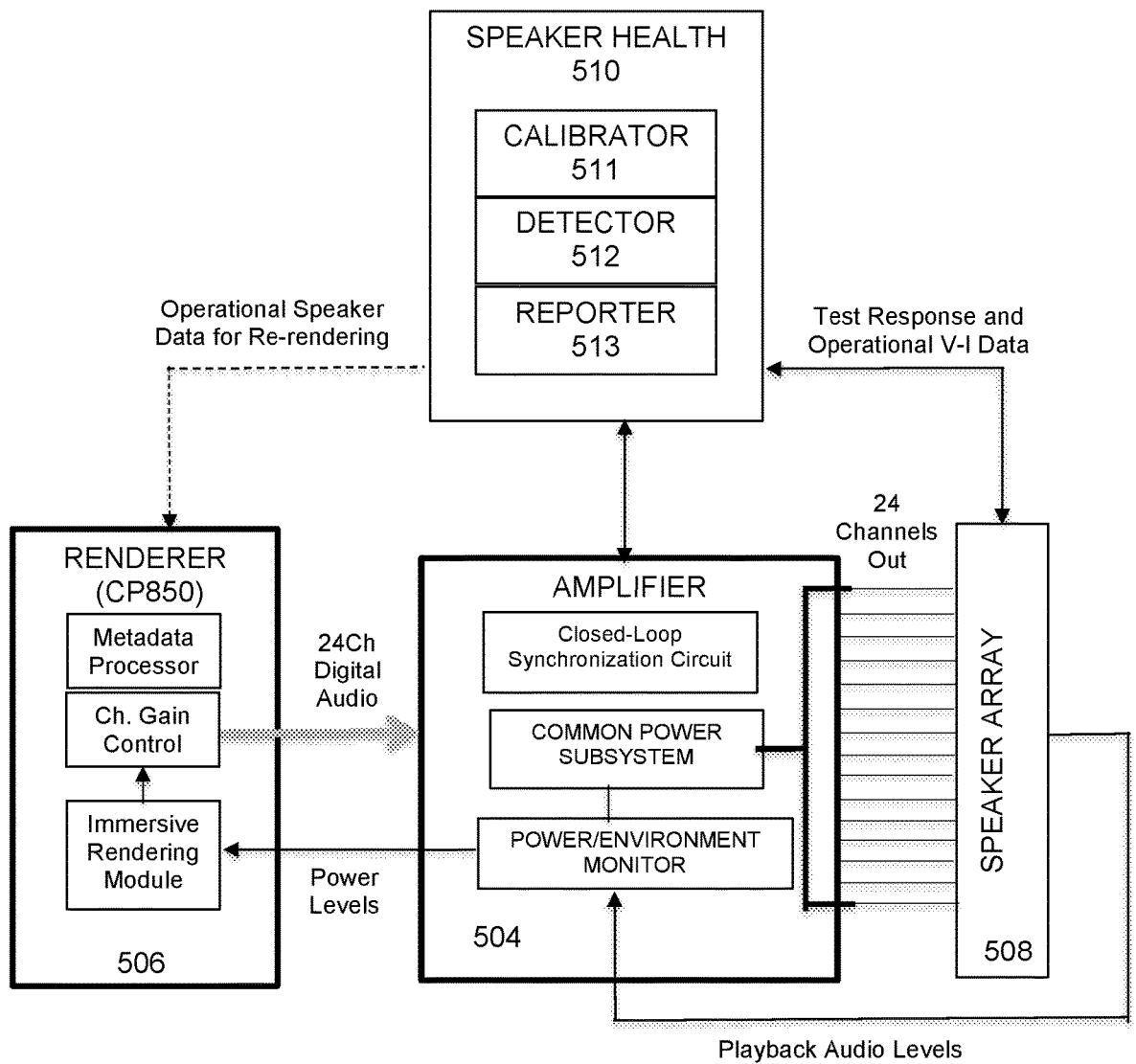
FIG. 5 illustrates a multi-channel amplifier operating in a rendering environment and having a speaker health monitoring component, under some embodiments.

At least part of the method of FIG. 4 may be implemented as a software instructions executed by certain processing components in or associated with the amplifier 206 or sound processor 204. Alternatively, they may be performed by hardware components in the amplifier 304. Such a system may be configured to playback certain advanced audio signals, such as immersive or object-based audio. FIG. 5 illustrates a multi-channel amplifier operating in a rendering environment and having a speaker health monitoring component, under some embodiments. As stated above, in an embodiment, the amplifier 504 is configured to work in conjunction with a compatible renderer 506 that provides the audio signals over the same number of channels (speaker feeds) output by the amplifier. Such a renderer may be a Dolby Atmos Cinema Processor CP850, or similar sound processor. This renderer plays back traditional 5.1 and 7.1 surround sound formats, as well as immersive audio content such as Dolby Atmos, which comprises audio objects and beds (channel-based audio). In general, audio objects can be considered as groups of sound elements that may be perceived to emanate from a particular physical location or locations in the listening environment. Such objects can be static (stationary) or dynamic (moving).

In such a system, audio objects are controlled by metadata that defines the position of the sound at a given point in time, along with other functions. When objects are played back, they are rendered according to the positional metadata using the speakers that are present, rather than necessarily being output to a predefined channel. In an immersive audio decoder, the channels are sent directly to their associated speakers or down-mixed to an existing speaker set, and audio objects are rendered by the decoder in a flexible manner. The parametric source description associated with each object, such as a positional trajectory in 3D space, is taken as an input along with the number and position of speakers connected to the decoder. The renderer utilizes certain algorithms to distribute the audio associated with each object across the attached set of speakers. The authored spatial intent of each object is thus optimally presented over the specific speaker configuration that is present in the listening environment.

For the embodiment of FIG. 5, the renderer 506 comprises an immersive audio rendering module and channel gain control to transmit the appropriate digital audio signals to the amplifier 504. A metadata processor processes the corresponding parametric position/location/trajectory data for audio objects to generate the N-channel speaker feeds to the amplifier 504. The amplifier 504 includes a common power subsystem that provides power to all channels of speaker array 508, and sets the per-channel gain values based on the audio content and input from a monitor component that monitors power, environmental and operating conditions. The amplifier 504 may also include a closed-loop synchronization circuit to ensure that channels are clocked and switched at the same time to mitigate noise, beats, and other distortion.

The number of speakers in speaker array 508 is assumed to be relatively high, such as 16 to 32 or more speakers, in which at least some speakers may be mounted in challenging locations, such as high wall or ceiling mounts. In an embodiment, the amplifier includes or is coupled to a health monitor unit 510 which monitors certain operating and health characteristics of the speakers and provides feedback to the renderer 506 or a user through a GUI or similar interface 511. For the embodiment shown, the speaker health component 510 includes certain functional sub-components of a calibrator 511, detector 512, and reporter 513 that perform the functions illustrated in the method of FIG. 4.

Figure 6:
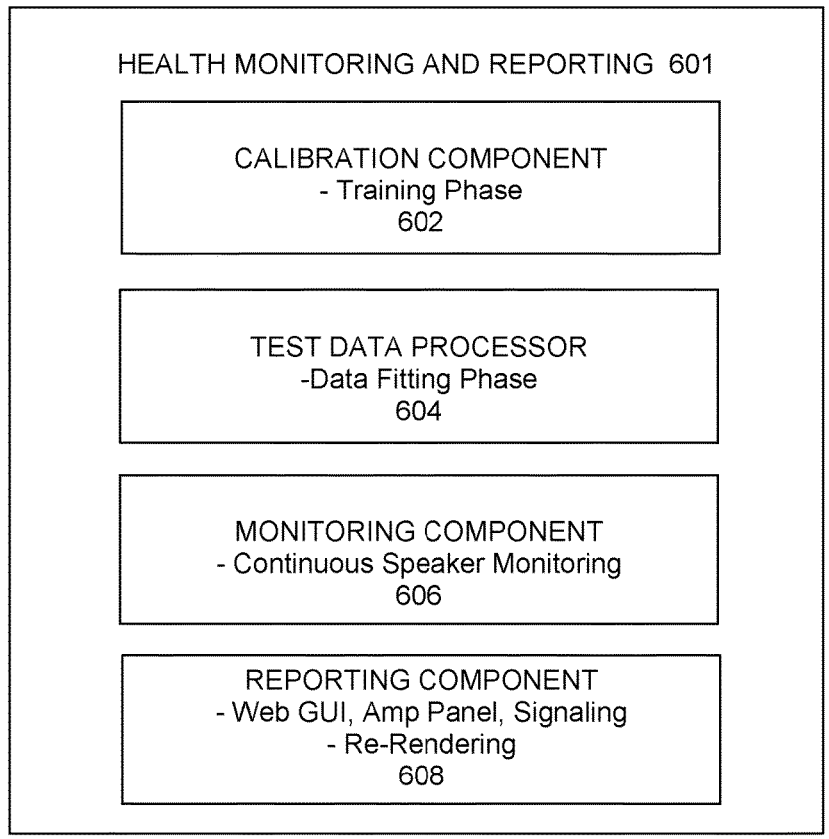
FIG. 6 illustrates certain functional components of a speaker health monitor process or component, under some embodiments.

FIG. 6 illustrates, in more detail, the functional components of a speaker health monitoring process or component 510, under some embodiments. In an embodiment, the health monitor process or health monitor component 601 executes a number of processes comprising a calibration component 602, a test data processor 604, a monitoring component 606, and reporting component 608.

As shown in FIG. 6, the speaker health monitor and reporting component 601 executes a calibration component or function 602. This component performs a calibration process on a known set of healthy speakers using a test signal, such as a pink noise test pattern, or similar test signal. This represents a training phase of the monitoring process. During the training phase, various V and I points are gathered from the feedback from the test signals and stored in memory. A number (N) of frequency bins (e.g., 29) are chosen for providing the V and I data. A pink noise test pattern is selected because it is time-invariant. Alternatively, any other custom test signal may be used depending on system configuration.

Figure 7A:
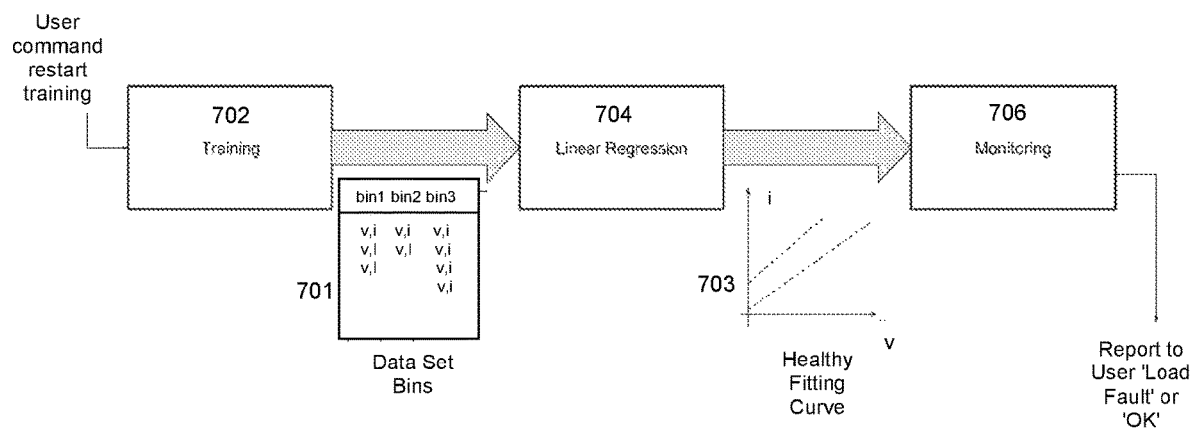
FIG. 7A illustrates the phases of the health monitoring function and corresponding data sets, under some embodiments.
Figures 7B, 7C:
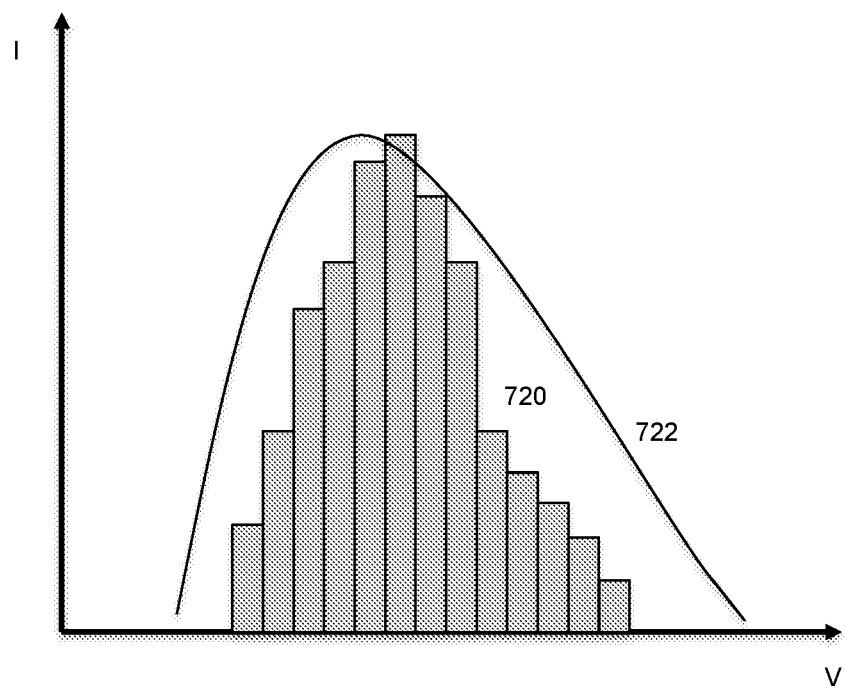
FIG. 7B illustrates a frequency bin data set for the system of FIG. 7A, under some embodiments.
FIG. 7C illustrates an example histogram used for V, I data bins, under some embodiments.

FIG. 7B illustrates a frequency bin data set, under some embodiments. Data set table 710 shows various V, I data points for each of the bins denoted Bin 0 to Bin N. Any appropriate number of bins may be used, and different numbers of V, I values may be provided for each bin, as shown.

In an embodiment, the frequency bins are arranged in ⅓ octave steps. The real part of the impedance Z measured in ⅓ octave steps is stored in the bins at different levels. In an embodiment, the levels are swept over a range of −40 dB to 0 dB and back down to −40 dB in certain level increments. The bins thus store the impedance versus frequency for each channel at a variety of levels. The bins may be arranged according to known standards, such as 13 bins of the SMPTE standard, or any other appropriate arrangement.

During the training mode, the speakers in the auditorium are swept in a configurable group pattern for the following reasons: 1) so that the installer is not subject to high levels of pink noise from multiple drivers, 2) so that the maximum power draw can be managed for the duration of the test, and 3) to ensure that the most optimal readings are read from the Hall effect sensors by minimizing crosstalk from high of energy levels on adjacent channels.

In an embodiment, the test audio signal is swept both up and back down over the prescribed range. This sweeping of the level up and back down excites (heats) the voice coil and indicates or allows for any thermal effects, since the impedance curve of a speaker may change with temperature. In this way, the system can accommodate for thermal effects to reduce the possibility of false positives during the comparison step.

After a sufficient amount of data is gathered, the data points are processed using the test data processor function 604. In an embodiment, test data is processed using a linear regression algorithm to fit what is considered to be a healthy speaker curve, as obtained during the baseline measurement step 402.

Once the healthy or optimal speaker curve has been obtained, the speaker health process enters in the monitoring phase of the monitoring component 606, where all the new points during actual speaker operation are collected are compared with the healthy speaker curve to detect speaker failures or problems and report them to the user via a GUI or similar reporting mechanism.

FIG. 7A illustrates the phases of the health monitoring function and corresponding data sets, under some embodiments. As shown in FIG. 7A, the training component 702 receives a user command to start or restart the training function. This inputs a pink noise test to each speaker. The output of the training phase is a V, I data set 701 with various V, I points for each frequency bin of a number of frequency bins. The data points are processed using a linear regression function 704, which outputs a healthy fitting curve 703 on a V-I plot. The monitoring phase 706 checks new V, I points against the curve and outputs a fault condition if any one point does not fit, or an OK signal if all points fit.

For the embodiment of FIG. 7A, the data set 701 comprises a database of columns denoted Bin0, Bin1, Bin2, Bin3, and so on up to BinN with different V,I values for each bin. This is shown in more detail in FIG. 7B. The healthy fitting curve 703 is a plot of V, I values with a horizontal V axis and a vertical I axis. Different data set and fitting curves, other than those explicitly shown, may also be used.

In an embodiment a histogram of the V, I data may be generated for the healthy speaker curve data stored in a time-series database so that changes in performance can be graphically displayed through the GUI since the date of installation. As is known, a histogram is a representation of the probability distribution estimate of numerical data. After the data is binned, such as shown in FIG. 7B, the range is divided into a series of intervals and the number of occurrences within each bin are counted and represented in a graph. FIG. 7C illustrates an example histogram used for V, I data bins, under some embodiments. As shown in FIG. 7C, the histogram 720 is drawn against a V-I plot with rectangles representing the frequency of V, I values in each bin. A fitting curve 722 represents a generalized shape of the probability distribution of the overall data set. FIG. 7C illustrates one example of a probability distribution of V, I data values, and other relative frequency plots may be used.

Figure 8:
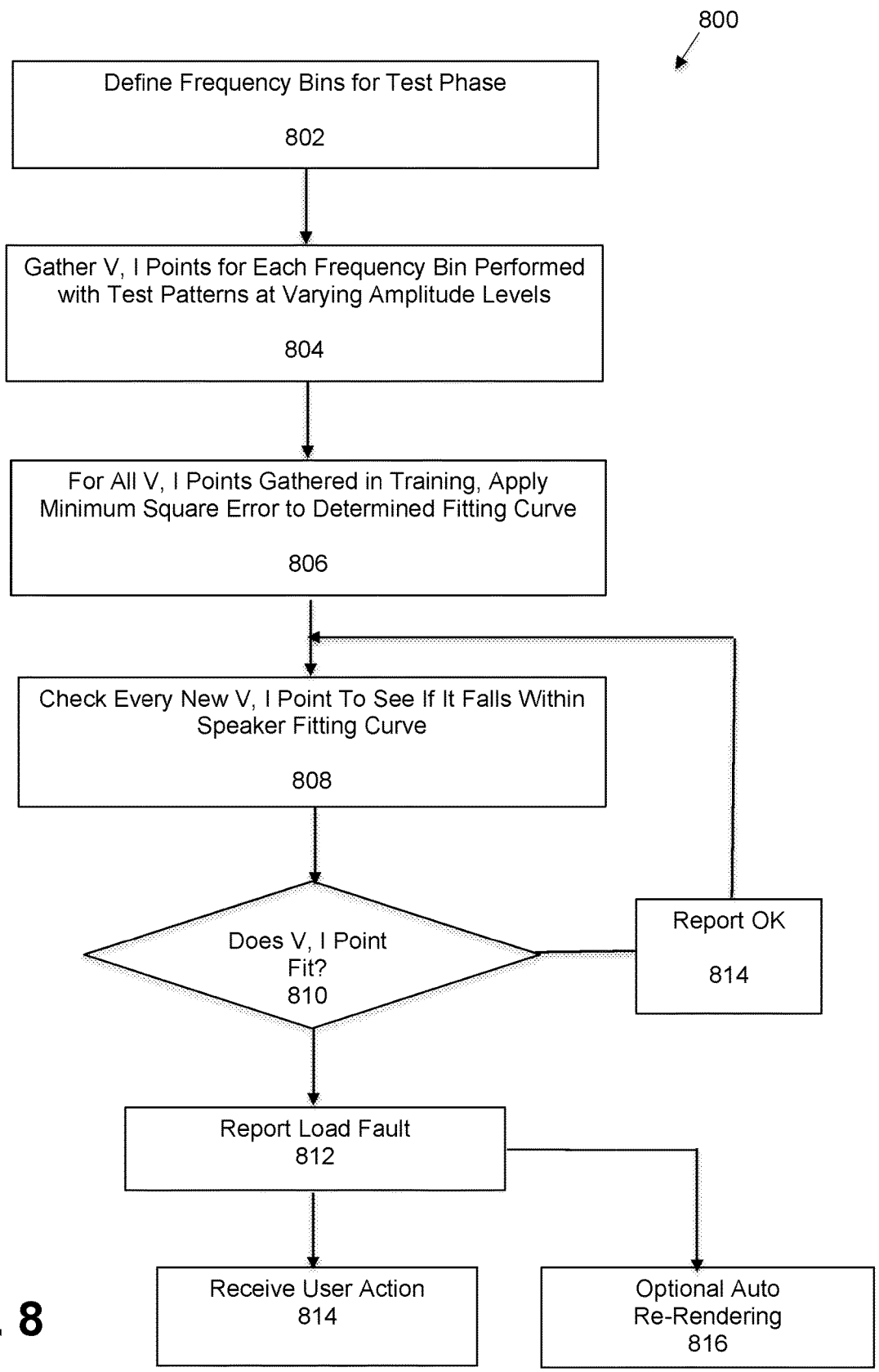
FIG. 8 is a flowchart illustrating a health monitoring method using the system of claim 7, under an embodiment.

FIG. 8 is a flowchart illustrating a health monitoring method using the system of claim 7, under an embodiment. The process 800 begins by defining the frequency bins (e.g., ⅓ octave bins) for the V, I points, 802. Any practical number of bins spanning a certain number of frequencies may be used. A typical number of bins may be 29, but any other number may be used. The training component sends the test signal to all of the speakers and gathers the resulting V, I points for each frequency bin for various amplitude levels, 804. This task may take on the order of several minutes for each channel, depending on system configuration. In a typical implementation, a training phase for a 32-channel system may take on the order of 20 minutes. In the data processor component, all of the gathered V, I points from the training phase are applied to a minimum square error algorithm to determine the corresponding fitting curve, 806. One fitting curve is generated for each frequency bin. This defines a healthy fitting curve on a V-I plot, as shown in FIG. 7A. Once the healthy fitting curves are defined, the monitoring component checks each new V, I point to see if matches or falls within the fitting curve tolerance, 808. The amount of variation from the actual fitting curve defines the fault tolerance of the system and may be set by the user as a percentage deviation (e.g., 10%) or similar metric. If a point does not fit within the defined tolerance, as determined in decision block 810, the monitor component reports a load fault to the user through a GUI or other reporting mechanism, 812. Otherwise it continues to check new V, I points and/or reports an OK condition, 814. Once a load fault is reported, the system can wait to receive a user action, such as an installer or technician fixing/removing a speaker, etc. to reset the system. Alternatively, the cinema processor can be configured to automatically re-render the content to attempt to compensate for the load fault, 816. During process 800, feedback from the monitoring component may also be provided to the renderer or cinema processor.

With reference to FIG. 6, with respect to the test signal, the calibration component 602 can be configured to send the same sequence of pink noise used in training; however, the previously collected training data is not overwritten. The live monitoring mode 606 is active during this sequence, and will evaluate the health of each channel selected. This is referred to as "test pattern" mode. The group selection criteria and pink noise levels will match exactly to what was used during speaker training. The only difference is the duration of the pink noise test pattern is much shorter than what was used during the training mode.

In an embodiment, a software-controlled state debouncing may be used in conjunction with the test and fitting algorithm and such a process may have an effect on the reported monitoring state. The state reported from this layer should be used by the system to evaluate the live test conditions, instead of directly accessing the algorithm. The debouncing process uses a temporal sliding window with unique parameters optimized for each FFT bin that automatically resets after a certain amount of time has elapsed. The window is paused whenever live monitoring data is not present. In other words, state will not change during long episodes of silence. This process is used because certain types of drivers may briefly go into a non-linear state when driven hard, which is especially true of large LFE (low-frequency effect) drivers or subwoofers. These could register as false negatives by the monitoring process. In order to prevent transient conditions from propagating into the software, a debouncing scheme is implemented after the algorithm to alleviate this effect.

Other filters or process modifiers may also be applied. For example, during live monitoring if a captured value lies outside of the range of the training window (above or below), the reading will be discarded. The software will wait for the next set of values that are within the data training window before evaluating the live condition. This means that content with very little dynamic range may not register a state change immediately, no matter how intense. Similar logic is also be applied to the raw sensor data, based on the capabilities of the instrumentation in the current hardware revision. Metadata is also generated for any "untrained" channels that may exist on a given card, so the same rejection logic can be applied. This logic may also be referred to as "crosstalk rejection." The software debouncing layer will be responsible for maintaining the internal state of the of the algorithm, if this should be necessary.

Certain functions of the health monitoring process may be externally managed through user control via the GUI. Others may be internally controlled by system settings. This control defines certain rules by which the test and monitoring functions operate. For example, rules may be defined such that no two adjacent channels will be trained in the auditorium simultaneously. Internally, the system will manage this request in two separate passes instead of one simultaneous action. The system can accommodate both bridged and non-bridged speakers. Any API that exposes 32 channels (or any other number) does not need to be concerned about which or what bridged pair is valid for configuration. Setting the flag for only the first occurring channel in a bridged pair array will suffice. Also, even though all 32 channels can be selected, the system will only train in groups of no more than eight (or any other subset) at a time.

In an embodiment, the speaker health API should provide the time estimate for the training phase. There may be hardware limitations that make it not possible or practical to measure real time data below a certain frequency (e.g., 23.44 hz) or above another frequency (e.g., 8110.24 Hz).

In an embodiment, the system provides a variable detection threshold per bin is provided. This variable detection threshold exists to reduce the possibility of reporting of false results from reading the Hall effect sensors due to large amounts of energy being present on adjacent channels. In addition to protection from adjacent channel crosstalk of trained channels, metadata will be generated for "untrained channels" that will also be fed into the same algorithm used for crosstalk rejection. This software-based crosstalk rejection algorithm that may be used for cases in which training data does not exist on any channel for a given amplifier. This may result in false results in the detection algorithm, if a substitute "V max" or "I max" value is not computed in place of what would be normally part of the training data for the given channel. For amps that contain a mix of trained and untrained channels, metadata is automatically computed for the untrained channels to use for this crosstalk rejection.

As described above, a known good V, I curve or data is obtained by taking actual measurements of a newly installed or known good speaker system. The data for a new or known good speaker system comprises "baseline" data that represents the speaker system operating in a sufficiently satisfactory condition. In an embodiment, the baseline data can be provided by inputting speaker specification data, such as known response curves, V-I data and so on. Such data can be input through an appropriate interface and in a manner appropriate to allow direct comparison to the measured V, I data obtained during the monitoring phase. For example, data can be provided to the user for a given speaker manufacturer (e.g., a full enclosure like a QSC or from the Dolby/SLS line), which will be loaded by the user from a web-based user interface or equivalent means. This data can be loaded into the system in place of running a full training session with the noise source. The system would then instead use the supplied baseline data, and proceed directly into active monitoring mode.

Figure 9:
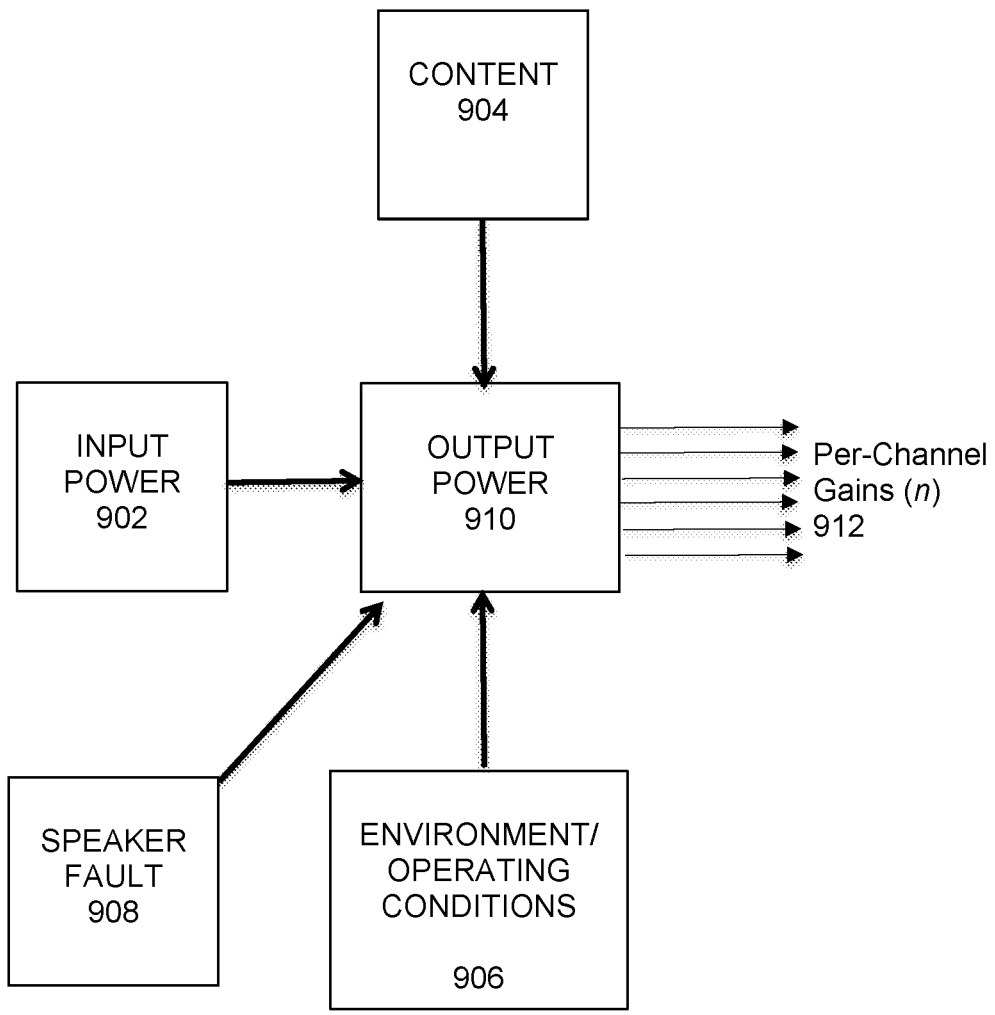
FIG. 9 illustrates the generation of per-channel gain levels based on certain amplifier operating characteristics, under some embodiments.

In an embodiment, the V, I data during operation and as compared to the baseline data may be sent from the amplifier back to the renderer or processor. This allows for re-rendering of the signal in response to any fault condition of a speaker or driver. For this embodiment, certain gain control functions may be provided to manage and change the gain of each individual channel based on the speaker health and operating conditions, as monitored by the monitor. FIG. 9 illustrates the generation of per-channel gain levels based on certain speaker operating characteristics, under some embodiments. As shown in FIG. 9, the per-channel gains 912 are derived from the output power 910 provided by the amp on each of the channels 1-n, where n is any appropriate number of channels, such as provided by the renderer. In an example embodiment in which the renderer corresponds to a Dolby Atmos Cinema Processor (CP850) or similar renderer, 24 audio channels are output from the renderer and amplified individually by amplifier 904. The output power 902 is a function of several inputs including the input power 902, the audio content 904 and the environmental/operational conditions 906.

In an embodiment, the per-channel gains can be set or modified depending on any speaker fault conditions detected by the speaker fault detector 908. In the case of any failing or failed speakers, speaker cables, output stages, or any other specific channel component, power to that channel may be attenuated or cut and other channels boosted accordingly to compensate. Other re-rendering or compensation measures may include changing the EQ, phase or other audio characteristics of the audio signal, cutting or boosting certain surround channels, and so on.

With respect to re-rendering, several possible steps can be undertaken. One example is the loss of a theatrical center channel. When this type of fault is detected, a failure notice is sent to the cinema processor to re-render the center channel into the main left/right (L/R) speaker arrays, otherwise, the show is considered "lost" due to the missing dialogue center channel. Other types of driver failures can be handled differently by the cinema processor based in room configuration, active macros, and so on. Mention of specific components, such as Dolby CP850 are intended for example only, and embodiments are not so limited.

Unless the context clearly requires otherwise, throughout the description and the claims, the words "comprise," "comprising," and the like are to be construed in an inclusive sense as opposed to an exclusive or exhaustive sense. Words using the singular or plural number also include the plural or singular number respectively. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not so limited. The description is intended to cover various modifications and similar arrangements as would be apparent to those skilled in the art. Therefore, the scope of the appended claims should be accorded the broadest interpretation so as to encompass all such modifications and similar arrangements.

Various aspects of the present invention may be appreciated from the following enumerated example embodiments (EEEs):

EEE 1. A method comprising:
taking current and voltage (V-I) measurements of one or more speakers when the one or more speakers are configured to operate in a reference mode in a listening area, to obtain a reference electrical impedance for the one or more speakers;
taking V-I measurements of the one or more speakers while the one or more speakers are operating in a normal operation mode of playing audio content in the listening area, to obtain an operating electrical impedance;
comparing the operating electrical impedance to the reference electrical impedance to determine a deviation between the operating and the reference electrical impedances; and
reporting, if the deviation exceeds a defined tolerance, the deviation to a repair personnel for enabling repair of an electrical or electro-mechanical fault of the one or more speakers by the repair personnel.

EEE 2. The method of EEE 1 further comprising performing a curve fitting operation using a minimum square error algorithm, to the reference electrical impedance generate a healthy fitting curve.

EEE 3. The method of EEE 2 wherein the comparing is performed by comparing the healthy fitting curve to an operating curve curve generated by the operating electrical impedance.

EEE 4. The method of any of EEEs 1 to 3 wherein the taking V-I measurements step comprises continuously gathering V, I points for a number of frequency bins for each channel of speakers at different output levels.

EEE 5. The method of EEE 4 wherein the different output levels comprise a range of −40 dB to 0 dB and the number of frequency bins comprise ⅓ octave steps.

EEE 6. The method of any of EEEs 1 to 5 further comprising playing a pink noise test signal through the speakers and taking V, I measurements of each speaker using one or more Hall effect sensors in an amplifier coupled to the one or more speakers.

EEE 7. The method of any of EEEs 1 to 6 wherein the reporting step comprises generating a visual message for display through one of an amplifier front panel or a web-based graphical user interface, or a text message transmitted to a computing device over a known or proprietary interface.

EEE 8. The method of any of EEEs 1-7 further comprising transmitting the operating electrical impedance to a renderer to facilitate re-rendering the audio content to compensate for the deviation.

EEE 9. The method of any of EEEs 1-8 wherein the reference electrical impedance is input to the system based on manufacturer provided speaker characteristics instead of measured values.

EEE 10. An apparatus for enabling repair of one or more speakers, comprising:
a calibration component generating a test signal to take current and voltage (V-I) measurements of one or more speakers when the one or more speakers are configured to operate in a reference mode in a listening area, to obtain a reference electrical impedance for the one or more speakers;
a monitor taking V-I measurements of the one or more speakers while the one or more speakers are operating in a normal operation mode of playing audio content in the listening area, to obtain an operating electrical impedance;

a comparator comparing the operating electrical impedance to the reference electrical impedance to determine a deviation between the operating and the reference electrical impedances; and an interface reporting, if the deviation exceeds a defined tolerance, the deviation to a repair personnel for enabling repair of an electrical or electro-mechanical fault of the one or more speakers by the repair personnel.

EEE 11. The apparatus of EEE 10 further comprising a data processor performing a curve fitting operation using a minimum square error algorithm, to the reference electrical impedance generate a healthy fitting curve.

EEE 12. The apparatus of any of EEEs 10 to 11 wherein the calibration component continuously gathers V, I points for a number of frequency bins for each channel of speakers over different output levels.

EEE 13. The apparatus of any of EEEs 10 to 12 wherein the calibration component plays a pink noise test signal through the speakers and takes V, I measurements of each speaker using one or more Hall effect sensors in an amplifier coupled to the one or more speakers, and wherein the different output levels comprise a range of −40 dB to 0 dB and the number of frequency bins comprise ⅓ octave steps.

EEE 14. The apparatus of any of EEEs 10 to 13 wherein the interface generates a signal for visual display through one of an amplifier front panel or a web-based graphical user interface, or a text message transmitted to a computing device over a known or proprietary interface.

EEE 15. A computer program product comprising instructions which, when the program is executed by a computer, cause the computer to carry out a method according to any one of the EEEs 1 to 10.

The invention claimed is:

1. A method comprising:
    defining a plurality of frequency bins;
    sending, during a training phase, a test signal at different amplitude levels to each speaker of a plurality of speakers, and gathering respective resulting test voltage (V) and current (I) points for the different amplitude levels and for each frequency bin;
    for each frequency bin, applying a linear regression algorithm to the respective test voltage and current points for the different amplitudes to obtain a respective reference electrical impedance of each speaker;
    sending, during a monitoring phase subsequent to said training phase, audio signals to the plurality of speakers, and gathering resulting new respective voltage and current points to obtain respective operating electrical impedances for the plurality of speakers for each frequency bin;
    for each speaker of the plurality of speakers, determining a respective deviation between the respective operating electrical impedance and the respective reference electrical impedance to identify a speaker for which the respective deviation exceeds a defined tolerance; and
    modifying one or more audio signals sent to one or more other speakers of the plurality of speakers to compensate for sound changes caused by the respective deviation of the identified speaker.

2. The method of claim 1, wherein the plurality of frequency bins is arranged in ⅓ octave steps.

3. The method of claim 1, wherein the different amplitude levels correspond to a range of −40 dB to 0 dB.

4. The method of claim 1, wherein the test signal is a pink noise test signal.

5. The method of claim 1, wherein the defined tolerance is amplitude or frequency dependent.

6. The method of claim 1, wherein the linear regression algorithm is a minimum square error algorithm.

7. The method of claim 1, further comprising re-rendering one or more of the audio signals based on the respective operating electrical impedance of the identified speaker.

8. A non-transitory computer-readable medium storing instructions that, when executed by a computer, cause the computer to perform operations comprising the method of claim 1.

9. The method of claim 1, wherein the modifying includes one or more of:
    changing one or more audio characteristics of an audio signal;
    changing equalization (EQ) of an audio signal;
    changing a phase of an audio signal;
    cutting power to one or more audio channels; and
    boosting one or more audio channels.

10. The method of claim 1, further comprising cutting or attenuating power to the identified speaker.

11. An apparatus, comprising:
    a calibration component configured to, during a training phase, provide a test signal at different amplitude levels to each speaker of a plurality of speakers, and to gather respective resulting test voltage (V) and current (I) points for the different amplitude levels for a plurality of frequency bins;
    a test data processor configured to, for each frequency bin, apply a linear regression algorithm to the respective test voltage and current points for the different amplitude levels to obtain a respective reference electrical impedance of each speaker; and
    a monitoring component configured to, during an operating phase subsequent to the training phase, send audio signals to the plurality of speakers and gather resulting new voltage and current points, to obtain respective operating electrical impedances for the plurality of speakers for each frequency bin, and further configured to determine a respective deviation between the respective operating electrical impedance and the respective reference electrical impedances to identify a speaker for which
    the respective deviation exceeds a defined tolerance,
    wherein the apparatus is configured to modify one or more audio signals sent to one or more other speakers of the plurality of speakers to compensate for sound changes caused by the respective deviation of the identified speaker.

12. The apparatus of claim 11, wherein the plurality of frequency bins is arranged in ⅓ octave steps.

13. The apparatus of claim 11, wherein the different amplitude levels correspond to a range of −40 dB to 0 dB.

14. The apparatus of claim 11, wherein the test signal is a pink noise test signal.

15. The apparatus of claim 11, wherein the defined tolerance is amplitude or frequency dependent.

16. The apparatus of claim 11, wherein the linear regression algorithm is a minimum square error algorithm.

17. The apparatus of claim 11, further comprising a renderer configured to re-render one or more of the audio signals based on the respective operating electrical impedance of the identified speaker.

* * * * *